United States Patent
Endo et al.

(10) Patent No.: US 10,707,268 B2
(45) Date of Patent: Jul. 7, 2020

(54) MAGNETORESISTIVE ELEMENT AND MAGNETIC MEMORY

(71) Applicant: TOSHIBA MEMORY CORPORATION, Minato-ku (JP)

(72) Inventors: Masaki Endo, Kawasaki (JP); Tadaomi Daibou, Yokohama (JP); Shumpei Omine, Meguro (JP); Akiyuki Murayama, Koga (JP); Junichi Ito, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 16/103,678

(22) Filed: Aug. 14, 2018

(65) Prior Publication Data

US 2018/0374894 A1    Dec. 27, 2018

Related U.S. Application Data (62) Division of application No. 15/445,221, filed on Feb. 28, 2017, now abandoned.

(30) Foreign Application Priority Data

Sep. 20, 2016 (JP) ................ 2016-183305

(51) Int. Cl.
*H01L 27/22* (2006.01)
*H01L 43/02* (2006.01)
(Continued)

(52) U.S. Cl.
CPC .......... *H01L 27/222* (2013.01); *H01L 27/228* (2013.01); *H01L 43/02* (2013.01);
(Continued)

(58) Field of Classification Search
CPC .......... H01L 43/08; H01L 43/12; H01L 43/10; H01L 27/228; H01L 27/222; H01L 43/02; H01L 21/8239
See application file for complete search history.

(56) References Cited

U.S. PATENT DOCUMENTS 6,127,045 A * 10/2000 Gill .................. B82Y 10/00
                                                  360/324.2
8,299,552 B2    10/2012 Nagase et al.
(Continued)

FOREIGN PATENT DOCUMENTS

JP    2009-81216 A    4/2009
JP    2009-81314      4/2009
(Continued)

OTHER PUBLICATIONS

Joon Pyo Kil, et al. "Perpendicular Magnetic Anisotropy for CoFeBZr/MgO", IEEE Transactions on Magnetics, vol. 51, No. 11, 2015, 4 pages.

*Primary Examiner* — Caridad Everhart
(74) *Attorney, Agent, or Firm* — Oblon, McClelland, Maier & Neustadt, L.L.P.

(57) ABSTRACT

A magnetoresistive element according to an embodiment includes: a first layer; a first magnetic layer; a second magnetic layer disposed between the first layer and the first magnetic layer; a nonmagnetic layer disposed between the first magnetic layer and the second magnetic layer; and an insulating layer disposed at least on side surfaces of the nonmagnetic layer, the first layer including: at least one element selected from a first group consisting of Hf, Zr, Al, Cr, and Mg; and at least one element selected from a second group consisting of Ta, W, Mo, Nb, Si, Ge, Be, Li, Sn, Sb, and P, and the insulating layer including at least one element selected from the first group.

12 Claims, 7 Drawing Sheets

(51) Int. Cl.
*H01L 43/12* (2006.01)
*H01L 43/08* (2006.01)
*H01L 43/10* (2006.01)

(52) U.S. Cl.
CPC .............. *H01L 43/08* (2013.01); *H01L 43/10* (2013.01); *H01L 43/12* (2013.01)

(56) References Cited

U.S. PATENT DOCUMENTS

| | | | |
|---|---|---|---|
| 8,817,426 B2 | 8/2014 | Gao et al. | |
| 9,117,924 B2 | 8/2015 | Kitagawa et al. | |
| 9,117,995 B2 | 8/2015 | Daibou et al. | |
| 9,184,375 B1 | 11/2015 | Tang et al. | |
| 9,281,468 B2 | 3/2016 | Min et al. | |
| 2004/0130431 A1* | 7/2004 | Matsukawa | B82Y 25/00 338/32 R |
| 2011/0233700 A1 | 9/2011 | Hayakawa et al. | |
| 2014/0131649 A1* | 5/2014 | Daibou | H01L 43/08 257/2 |
| 2015/0069554 A1 | 3/2015 | Nakayama et al. | |
| 2015/0249206 A1 | 9/2015 | Kim et al. | |
| 2015/0268116 A1* | 9/2015 | Fuji | H01L 43/12 438/3 |
| 2016/0180905 A1 | 6/2016 | Kim et al. | |
| 2017/0062712 A1 | 3/2017 | Choi | |

FOREIGN PATENT DOCUMENTS

| | | |
|---|---|---|
| JP | 2013-187305 | 9/2013 |
| JP | 2013-243220 | 12/2013 |
| JP | 2014-99497 | 5/2014 |
| JP | 2015-2352 | 1/2015 |
| JP | 2015-176933 A | 10/2015 |
| JP | 2015-212996 | 11/2015 |
| JP | 2016-15490 | 1/2016 |
| JP | 5897448 | 3/2016 |

* cited by examiner

MAGNETORESISTIVE ELEMENT AND MAGNETIC MEMORY

CROSS REFERENCE TO RELATED APPLICATIONS

This application is a division of U.S. patent application Ser. No. 15/445,221, filed on Feb. 28, 2017; which is based upon and claims the benefit of priority from prior Japanese Patent Application No. 2016-183305 filed on Sep. 20, 2016 in Japan, the entire contents of which are incorporated herein by reference.

FIELD

Embodiments described herein relate generally to magnetoresistive elements and magnetic memories.

BACKGROUND

Magneto tunnel junction (MTJ) elements are used as magnetoresistive elements of magnetic random access memories (MRAM). The MTJ elements include a magnetic material and an insulating material such as MgO. Therefore, processing the MTJ elements by reactive ion etching (RIE) using halogen gas, which is commonly used in the semiconductor field, is difficult. If the MTJ elements are processed by RIE, a corrosion problem may be caused due to their weak resistance to corrosion. Furthermore, since the MTJ elements include many materials that are difficult to etch, etching itself may be difficult to be performed.

In order to deal with this problem, a milling process using Ar ions that is an inert gas may be employed to process the MTJ elements. However, the milling process with Ar ions physically sputters atoms. As a result, the sputtered atoms may adhere to side surfaces of the MTJ element to form a shunt path in a tunnel barrier layer of the MTJ element. This may degrade the magnetoresistance (MR), and in the worst case, cause a short-circuit failure in the device. Thus, when MTJ element is processed by milling, it is important not to cause the shunt path due to a layer of atoms adhering to side surfaces of the MTJ element.

DETAILED DESCRIPTION

A magnetoresistive element according to an embodiment includes: a first layer; a first magnetic layer; a second magnetic layer disposed between the first layer and the first magnetic layer; a nonmagnetic layer disposed between the first magnetic layer and the second magnetic layer; and an insulating layer disposed at least on side surfaces of the nonmagnetic layer, the first layer including: at least one element selected from a first group consisting of Hf, Zr, Al, Cr, and Mg; and at least one element selected from a second group consisting of Ta, W, Mo, Nb, Si, Ge, Be, Li, Sn, Sb, and P, and the insulating layer including at least one element selected from the first group.

Embodiments will now be explained with reference to the accompanying drawings. It should be noted, however, that the drawings are schematic or conceptual, and the dimensions and the ratio in each drawing do not necessarily match the actual ones. Even if two or more drawings show the same portion, the dimensions and the ratio of the portion may differ in each drawing. In particular, embodiments described below are simply examples of magnetoresistive elements embodying the technical idea of the present invention. Therefore, the technical idea of the present invention is not defined by the shape, the structure, the location of each component. In the descriptions below, an identical reference numeral may be assigned to two or more components having the same function and the structure, and the explanation of these components are repeated only when it is necessary to do so.

First Embodiment

Figure 1:
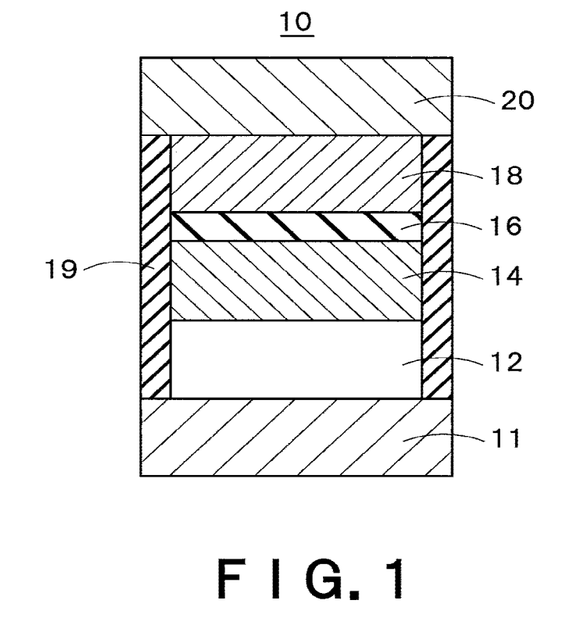
FIG. 1 is a cross-sectional view of a magnetoresistive element according to a first embodiment.

FIG. 1 shows a cross section of a magnetoresistive element according to a first embodiment. The magnetoresistive element 10 according to the first embodiment has a structure in which a lower electrode 11, a base layer (first layer) 12, a magnetic layer 14, a nonmagnetic layer 16, a magnetic layer 18, and an upper electrode 20 are stacked in this order. A protective layer 19 of an insulating material is disposed on side surfaces of a multilayer structure including the base layer 12, the magnetic layer 14, the nonmagnetic layer 16, and the magnetic layer 18. The protective layer 19 is disposed to cover at least the side surfaces of the nonmagnetic layer 16. A side surface herein is a surface which extends along the stacking direction of the multilayer structure, and which is different from the lower surface and the upper surface that extend to cross the stacking direction of the multilayer structure.

One of the magnetic layer 14 and the magnetic layer 18 acts as a storage layer, and the other acts as a reference layer. The magnetization direction of the storage layer is changeable, and the magnetization direction of the reference layer is fixed. What is meant by "the magnetization direction is changeable" is that the magnetization direction may be changed after a write current is caused to flow between the lower electrode 11 and the upper electrode 20 of the magnetoresistive element 10. What is meant by "the magnetization direction is fixed" is that the magnetization direction is unchangeable after a write current is caused to flow between the lower electrode 11 and the upper electrode 20 of the magnetoresistive element 10. The magnetization direction of the storage layer and the magnetization direction of the reference layer may be parallel or perpendicular to the stacking direction of the multilayer structure. If the magnetization directions are parallel to the stacking direction, both the storage layer and the reference layer have perpendicular magnetic anisotropy. If the magnetization directions are perpendicular to the stacking direction both the storage layer and the reference layer have in-plane magnetic anisotropy.

(Write Operation)

A write operation for writing data to the magnetoresistive element 10 according to the first embodiment having the aforementioned structure will be described. For convenience of explanation, for example, the magnetic layer 14 is the storage layer and the magnetic layer 18 is the reference layer in the descriptions of the write operation.

The write current is caused to flow between the lower electrode 11 and the upper electrode 20 in a direction perpendicular to the film plane. If the magnetic layer 14 is the storage layer, the magnetic layer 18 is the reference layer, and the magnetization direction of the magnetic layer 14 and the magnetization direction of the magnetic layer 18 are antiparallel (opposite) to each other, the write current is caused to flow from the magnetic layer 14 to the magnetic layer 18. In this case, electrons flow from the magnetic layer 18 to the magnetic layer 14 through the nonmagnetic layer 16. Passing through the magnetic layer 18, the electrons are spin-polarized before flowing into the magnetic layer 14. The spin-polarized electrons that have spin in the same direction as the magnetization direction of the magnetic layer 14 pass through the magnetic layer 14, but the spin-polarized electrons that have spin in the opposite direction to the magnetization direction of the magnetic layer 14 exerts spin torque to the magnetization of the magnetic layer 14, so that the magnetization direction of the magnetic layer 14 is changed to be in the same as the magnetization direction of the magnetic layer 18. As a result, the magnetization direction of the magnetic layer 14 is switched to be parallel to (the same as) the magnetization direction of the magnetic layer 18.

If the magnetization direction of the magnetic layer 14 is parallel to the magnetization direction of the magnetic layer 18, the write current is caused to flow from the magnetic layer 18 to the magnetic layer 14. In this case, electrons flow from the magnetic layer 14 to the magnetic layer 18 through the nonmagnetic layer 16. Passing through the magnetic layer 14, the electrons are spin-polarized, and the spin-polarized electrons flow into the magnetic layer 18. The spin-polarized electrons that have spin in the same direction as the magnetization direction of the magnetic layer 18 pass through magnetic layer 18, but the spin-polarized electrons having spin in the opposite direction to the magnetization direction of the magnetic layer 18 are reflected at the interface between the nonmagnetic layer 16 and the magnetic layer 18, and flow into the magnetic layer 14 through the nonmagnetic layer 16. As a result, the spin-polarized electrons exert spin torque to the magnetization of the magnetic layer 14, so that the magnetization of the magnetic layer 14 is changed to be in a direction opposite to the magnetization direction of the magnetic layer 18. Accordingly, the magnetization of the magnetic layer 14 is switched to be antiparallel to the magnetization of the magnetic layer 18. Data is read from the magnetoresistive element 10 according to the first embodiment by, for example, causing a read current to flow between the lower electrode 11 and the upper electrode 20, and measuring the voltage between the lower electrode 11 and the upper electrode 20.

Although the magnetic layer 14 is the storage layer and the magnetic layer 18 is the reference layer in the above explanations, the magnetic layer 14 may be the reference layer and the magnetic layer 18 may be the storage layer. In such a case, the direction of the write current is opposite to the direction in the above explanations.

Next, the material of each portion of the magnetoresistive element 10 will be described.

(Lower Electrode 11)

The lower electrode 11 is preferably formed of a material having a low electric resistance and superior in diffusion resistance. For example, the lower electrode 11 is preferably formed of Cu to have a low electric resistance, and Ta to improve the diffusion resistance. Therefore, a multilayer structure in which a Cu layer is sandwiched by Ta layers is more preferable.

(Base Layer 12)

The base layer 12 is preferably formed of a material that is easy to form an oxide or nitride when adhering to at least the side surfaces of the nonmagnetic layer 16 during an etching step to define the outer shape of the multilayer structure including the base layer 12, the magnetic layer 14, the nonmagnetic layer 16, and the magnetic layer 18 in a manufacturing method that will be described later. The oxide or nitride of the material of the base layer 12 preferably has an insulating property and a high breakdown voltage. For example, the base layer 12 may be an amorphous layer including at least one element selected from the first group consisting of Hf, Zr, Al, Cr, and Mg, and at least one element selected from the second group consisting of Ta, W, Mo, Nb, Si, Ge, Be, Li, Sn, Sb, and P. The amorphous layer here may partially include crystal. Amorphous layers have good flatness, and a magnetic layer formed on an amorphous layer has good crystallinity. The base layer 12 may also be a layer of an alloy including at least one element selected from the first group and at least one element selected from the second group.

(Magnetic Layer 14 and Magnetic Layer 18)

The magnetic layer 14 and the magnetic layer 18 preferably have one-directional anisotropy. The effective thickness of these layers is preferably from 0.1 nm to 20 nm. The "effective thickness" here means a thickness obtained by subtracting the thickness of magnetic dead layer from the thickness of each layer, i.e., the thickness of only the region having magnetic order. The effective thickness of these magnetic layers is required not to make these magnetic layers superparamagnetic. Therefore, the thickness is more preferably 0.4 nm or more. A Heusler alloy, such as $Co_2FeAl_{1-x}Si_x$ or $Co_2Mn_{1-x}Fe_xSi$, may be used to form the magnetic layer 14 and the magnetic layer 18.

The magnetic layers 14 and 18 may also be formed of at least one metal selected from Co, Fe, or Ni, and an alloy of these metals such as Co—Pt, Co—Fe—Pt, Fe—Pt, Co—Fe—Cr—Pt, Co—Cr—Pt, Co—Pd, NiMnSb, $Co_2$MnGe, $Co_2$MnAl, $Co_2$MnSi, CoCrFeAl, MnGa, $Mn_3$Ga, or $Mn_3$Ge. As used herein, a phrase referring to "at least one of" a list of items refers to any combination of those items, including a single member. As an example, "at least one of: a, b, or c" is intended to cover a, b, c, a-b, a-c, b-c, and a-b-c."

The storage layer may be formed of CoFeB having a thickness of 0.4 nm to 2.0 nm. The reference layer may be an artificial superlattice layer obtained by stacking, for example, TbCoFe, Co, and Pt, or a crystal layer of FePt having the $L1_0$ ordered structure. If a CoFeB layer acting as an interfacial magnetic layer is disposed between the reference layer and the nonmagnetic layer (intermediate layer) 16, the spin polarization of the interface between the reference layer and the nonmagnetic layer may be improved to obtain a high magnetoresistance ratio (MR ratio). The thickness of the CoFeB layer acting as the interfacial magnetic layer is preferably 0.1 nm to 5.0 nm for example, and more preferably 0.4 nm to 3.0 nm. The magnetic layers 14 and 18 may also be formed of a magnetic semiconductor such as GeMn, SiCNi, SiCMn, SiCFe, ZnMnTe, ZnCrTe, BeMnTe, ZnVO, ZnMnO, ZnCoO, GaMnAs, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, or SiGeMn.

The magnetic characteristics and the physical characteristics such as crystallinity, mechanical characteristics, and chemical characteristics of the magnetic layers 14 and 18 may be adjusted by adding a material to these layers, such as titanium (Ti), vanadium (V), chromium (Cr), silver (Ag), copper (Cu), gold (Au), aluminum (Al), gallium (Ga), phosphorus (P), indium (In), ruthenium (Ru), osmium (Os), rhenium (Re), tantalum (Ta), boron (B), carbon (C), oxygen (O), nitrogen (N), palladium (Pd), platinum (Pt), hafnium (Hf), zirconium (Zr), iridium (Ir), tungsten (W), molybdenum (Mo), niobium (Nb), or a rare earth element.

(Nonmagnetic Layer 16)

The nonmagnetic layer 16 is formed of a nonmagnetic material such as a nonmagnetic metal, a nonmagnetic semiconductor, and an insulating material. If an insulating material is used to form the nonmagnetic layer 16, the nonmagnetic layer 16 acts as a tunnel barrier layer, and the magnetoresistive element 10 becomes an MTJ element. The nonmagnetic layer 16 may also be formed of MgO having a thickness of about 1 nm, for example. In this case, a high MR ratio may be obtained.

(Protective Layer 19)

The protective layer 19 is formed of an insulating material including at least one of the elements included in the base layer 12. Therefore, the protective layer 19 is formed of an insulating material including an element in the base layer 12, such as at least one element selected from the group consisting of Hf, Zr, Al, Cr, and Mg, or at least one element selected from the group consisting of Hf, Zr, Al, Cr, and Mg included in the base layer 12, and B. The protective layer 19 has an insulating property obtained by forming an oxide or nitride of a material of the base layer 12. Therefore, the protective layer 19 is formed of a material of the base layer 12 with oxygen (O), or nitrogen (N). The valence state of the oxide or nitride of the protective layer 19 does not matter, if the insulating property is secured.

(Upper Electrode 20)

The upper electrode 20 has a function of an electrode and also a mask used to pattern the magnetoresistive element 10. Therefore, the upper electrode 20 is preferably formed of a material having a low electric resistance and good diffusion resistance and etching resistance or milling resistance. For example, a multilayer film including a Ta layer and a Ru layer is used to form the upper electrode 20.

(Modification)

Figure 2:
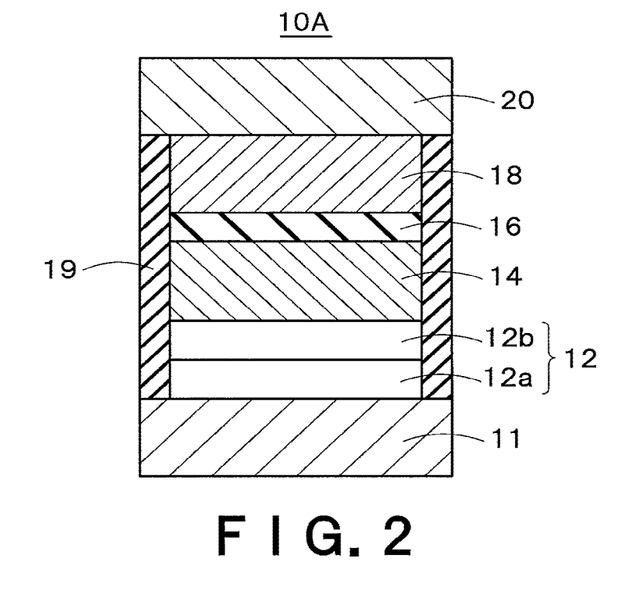
FIG. 2 is a cross-sectional view of a magnetoresistive element according to a modification of the first embodiment.

FIG. 2 shows a cross section of a magnetoresistive element according to a modification of the first embodiment. The magnetoresistive element 10A according to the modification includes a base layer (first layer) 12 corresponding to the base layer 12 of the magnetoresistive element 10 according to the first embodiment shown in FIG. 1, which has a multilayer structure including a base layer (second layer) 12a and a base layer (third layer) 12b disposed on the base layer 12a.

The base layer 12a includes at least one element selected from the first group consisting of Hf, Zr, Al, Cr, and Mg, and the base layer 12b includes at least one element selected from the second group consisting of Ta, W, Mo, Nb, Si, Ge, Be, Li, Sn, Sb, and P. The base layer 12 may have a multilayer structure in which two or more base layers 12a and two or more base layers 12b are alternately stacked. In this case, the base layer 12a may include a second group element, and the base layer 12b may include a first group element. The thickness of the base layer 12 may be 15 nm or more, or 20 nm or more. The base layer 12a is preferably thicker than the base layer 12b. The thickness of the base layer 12a may be less than 10 nm, or 5 nm or less. The base layer 12b may have a thickness of, for example, a single atom layer or more, and several nanometers or less.

The base layer 12 may also be a layer including at least one element selected from the first group consisting of Hf, Zr, Al, Cr, and Mg and at least one element selected from the second group consisting of Ta, W, Mo, Nb, Si, Ge, Be, Li, Sn, Sb, and P, and having a first region and a second region disposed between the first region and the magnetic layer 14, the concentration of the element selected from the second group preferably being higher in the second region than in the first region. The concentration of the element selected from the first group may be higher or lower in the first region than in the second region. The second region preferably extends, for example, for several angstroms from the interface with the magnetic layer 14.

The base layer 12 may also be a layer of an alloy including at least one element selected from the first group consisting of Hf, Zr, Al, Cr, and Mg, and at least one element selected from the second group consisting of Ta, W, Mo, Nb, Si, Ge, Be, Li, Sn, Sb, and P.

(Manufacturing Method)

A method of manufacturing the magnetoresistive element 10A according to the modification of the first embodiment will be described with reference to FIGS. 3A to 3C. The base layer 12 has the multilayer structure including the base layer 12a and the base layer 12b as shown in FIG. 2.

Figure 3A:
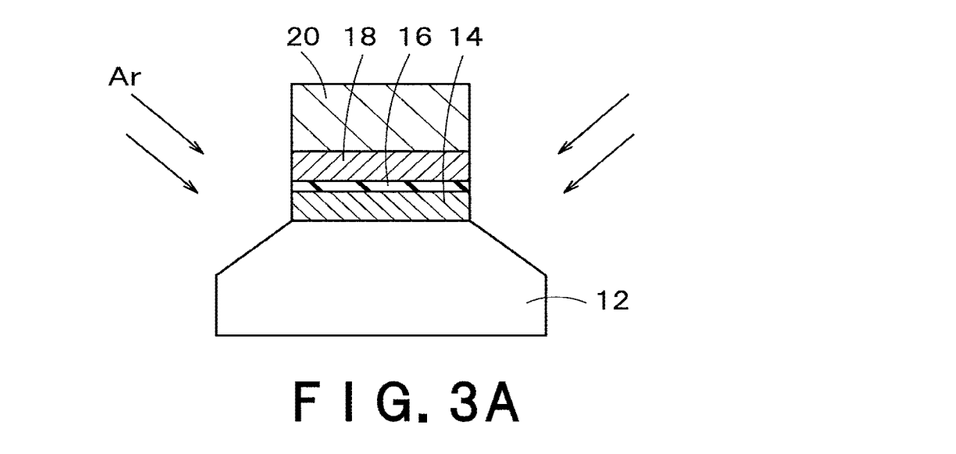
FIGS. 3A to 3C are cross-sectional views for explaining a method of manufacturing the magnetoresistive element according to the first embodiment.

A multilayer structure in which the base layer 12, the magnetic layer 14, the nonmagnetic layer 16, the magnetic layer 18 and the upper electrode 20 are stacked in this order is formed as shown in FIG. 3A. Subsequently, the multilayer structure is patterned to define the outer shape (planar shape) of the magnetoresistive element by first ion milling using an inert gas such as Ar, Kr, or Xe gas. In this example, Ar ions are used. The incident angle of the ions in the first ion milling is adjusted to be oriented at an angle of about 50° with respect to the direction perpendicular to the top surface of the upper electrode 20. This may prevent the formation of deposition layers on side surfaces of the nonmagnetic layer 16 as a result of the first ion milling. The first ion milling is continued until the upper portion of the base layer 12, for example the base layer 12b, is processed.

Figure 3B:
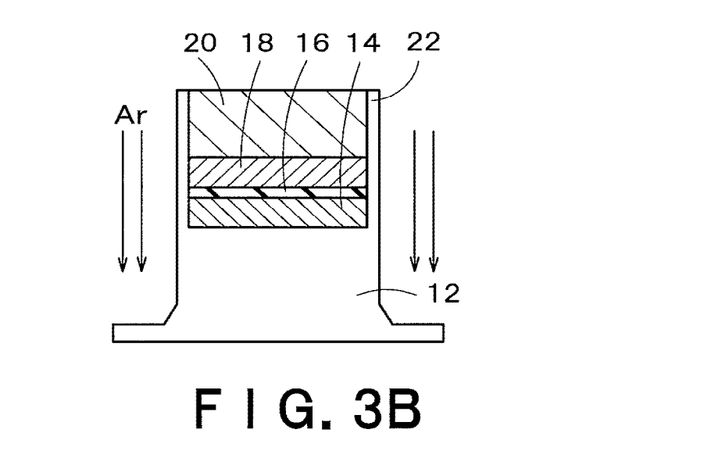

Thereafter, second ion milling is performed with the incident angle of Ar ions being changed to be perpendicular to the film plane as shown in FIG. 3B. The base layer 12 is further milled by the second ion milling. As a result, a portion of the base layer 12, for example the base layer 12a, is milled by the Ar ions and deposited on the sidewalls of the magnetoresistive element 10 to form deposition layers 22. The direction in which the ions are ejected in the second ion milling is preferably closer to the direction perpendicular to the film plane of the top surface of the upper electrode of the magnetoresistive element 10 than the direction in which the ions are ejected in the first ion milling.

Figure 3C:
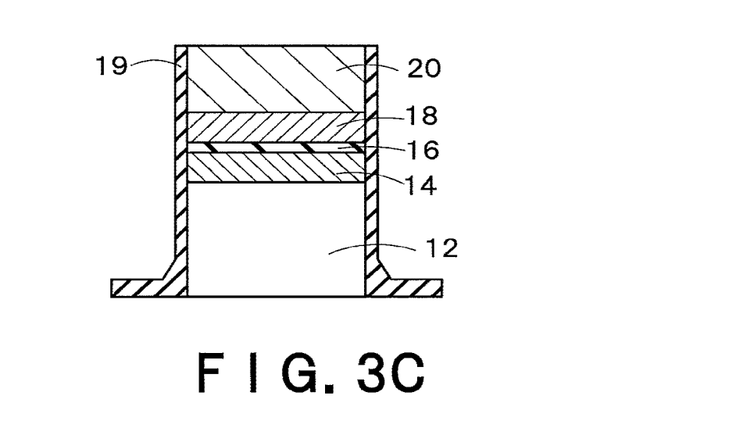

Thereafter, the deposition layers 22 deposited on the side surfaces of the magnetoresistive element 10 are oxidized or nitrided to form protective layers 19 that are insulated, as shown in FIG. 3C.

The deposition layers 22 are oxidized by, for example, exposure to the atmosphere. The deposition layers 22 may also be fully oxidized by exposure to oxygen gas, oxygen radicals, and oxygen cluster ions in the vacuum, besides the exposure to the atmosphere. The deposition layers 22 are nitrided by, for example, nitrogen radicals, nitrogen plasma, or nitrogen cluster ions. The valence state of the oxide or nitride of the protective layers 19 does not matter, if the insulating property is secured.

If the deposition layers 22 deposited on the side surfaces of the nonmagnetic layer 16 are conductive, the magnetic layer and the magnetic layer 18 are short-circuited via the deposition layers 22 on the side surfaces of the nonmagnetic layer 16. In order to prevent the short-circuit, the resistivity of the protective layers 19, which are formed as a result of the oxidation of the deposition layers 22, is preferably 0.0005 $\Omega cm^2$ or more. Even if the protective layers 19 are insulated due to the oxidation of the deposition layers 22 deposited on the side surfaces of the nonmagnetic layer 16, if the breakdown voltage of the protective layers 19 is lower than that of the nonmagnetic layer 16, the apparent breakdown voltage of the device is reduced, resulting in the degradation of the resistance of the magnetoresistive element 10 when read and write operations are repeatedly performed. Therefore, the material of the deposition layers 22 deposited on the side surfaces of the nonmagnetic layer 16 is preferably the same as that of the nonmagnetic layer 16, or a material having a high breakdown electric field when oxidized. The breakdown electric field of the nonmagnetic layer 16 of MgO or MgO with B is about 5 to 12 MV/cm. Therefore, the deposition layers 22 are preferably formed of a material that becomes MgO or MgBO when oxidized, or a material with a breakdown electric field of 5 MV/cm or more when oxidized. For example, the deposition layers are preferably formed of an insulating material including at least one element selected from the group consisting of Hf, Zr, Al, Cr, and Mg.

In the step shown in FIG. 3C, the oxidation to insulate the deposition layers 22 needs exposure to oxygen gas, oxygen radicals, or oxygen plasma. If the oxygen concentration is too much in the oxidation of the deposition layers 22, the magnetic layer 14 and the magnetic layer 18 are also oxidized, and the magnetic characteristics of these layers are degraded, which causes the degradation of the thermal stability. The thermal stability degradation is unfavorable. Therefore, the oxidation process to oxidize the deposition layers 22 needs to fully oxidize the deposition layers 22 without oxidizing the magnetic materials. Thus, the material of the deposition layers 22 is preferably easier to be oxidized than the material of the magnetic layer 14 and the magnetic layer 18.

Oxides of Hf, Zr, Al, Cr, Mg, Fe, and Co differ in the standard free energy $\Delta G$ (kJ/mol). The standard free energy change for magnesium oxide (Mg—O), hafnium oxide (Hf—O), zirconium oxide (Zr—O), aluminum oxide (Al—O), and chromium oxide (Cr—O) has a large minus value. This means that Hf, Zr, Al, Cr, and Mg are easier to bond with oxygen than Fe or Co included in the magnetic layer 14 and the magnetic layer 18. Therefore, if the deposition layers 22 deposited on the side surfaces of the magnetoresistive element 10 include a material containing Hf, Zr, Al, Cr, or Mg, the deposition layers 22 may be fully oxidized to act as a good insulating material by oxidation such as exposure to oxygen gas that is weak enough not to oxidize the magnetic layer 14 and the magnetic layer 18. Thus, the deposition layers 22 are preferably formed of a material including Hf, Zr, Al, Cr, or Mg.

The deposition layers 22 may be insulated by nitriding by, for example, nitrogen radicals, nitrogen plasma, or nitrogen cluster ions. The nitriding of the deposition layers 22 results in a high resistance without causing damage to the magnetic material due to oxidation. The valence state of the oxide or nitride of the protective layers 19 does not matter, if the insulating property is secured.

As described above, the magnetoresistive element 10 according to the first embodiment includes the base layer 12 including a material containing, for example, at least one element selected from the group consisting of Hf, Zr, Al, Cr, and Mg. By the milling of the magnetoresistive element 10, part of the atoms sputtered from the base layer 12 is deposited on the side surfaces of the magnetoresistive element 10 to form the deposition layers 22. By insulating the deposition layers 22, the protective layers 19 including one or more elements of the base layer 12 are formed on the side surfaces of the magnetoresistive element 10.

The deposition layers 22 may be formed of a material including, in particular, Hf, Zr, Al, Cr, or Mg. These materials are easier to be oxidized than the material of the magnetic layer 14 and the magnetic layer 18. The resultant oxides have a high breakdown electric field.

As described above, the magnetoresistive element according to the first embodiment is capable of suppressing insulation failure.

Figure 4:
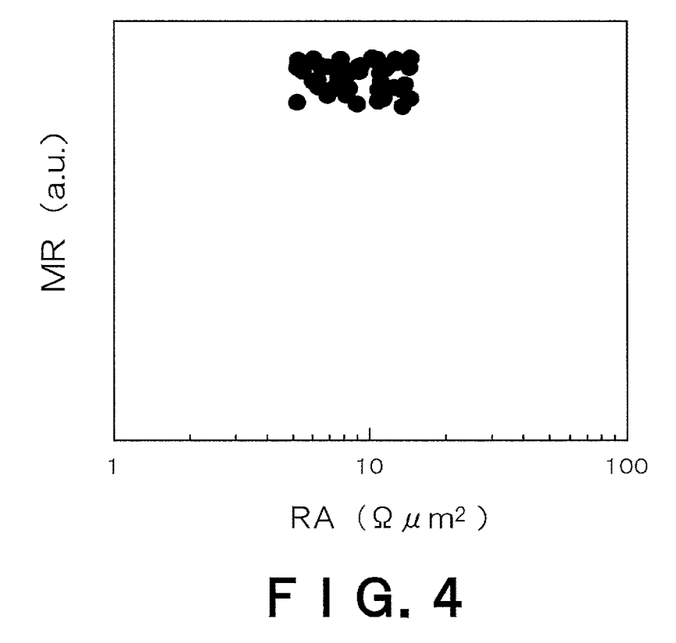
FIG. 4 is a graph showing the relationship between the sheet resistance and the MR of the magnetoresistive element according to the first embodiment.

If the protective layers 19 on the side surfaces of the nonmagnetic layer 16 remain conductive, the resistance change rate MR decreases as the resistance R of the magnetoresistive element decreases. However, the resistance change rate MR of the magnetoresistive element according to the first embodiment does not become low as the resistance R becomes low, as shown in FIG. 4. Therefore, the number of devices with defective bits caused by the insulation failure of the protective layers 19 may be decreased, which may increase the yield. FIG. 4 is a graph showing a measurement result of the relationship between the sheet resistance RA $\Omega \mu m^2$) and the MR (arbitrary unit) of a plurality of magnetoresistive elements manufactured by the process illustrated in FIGS. 3A to 3C.

Second Embodiment

Figure 5:
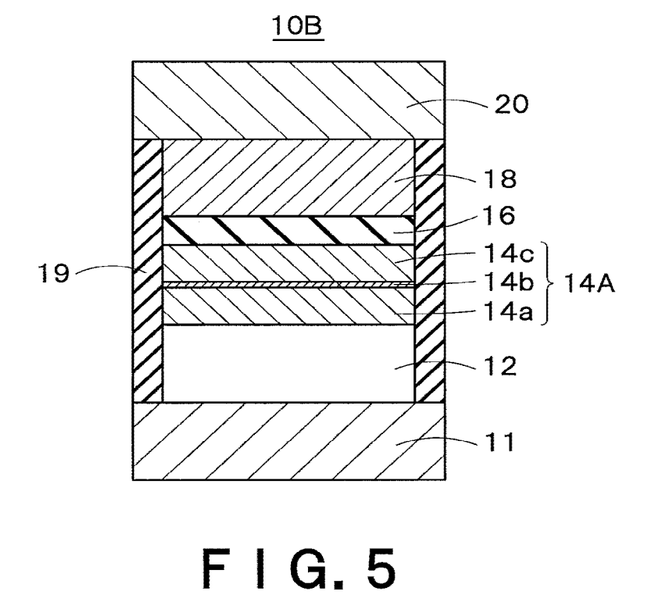
FIG. 5 is a cross-sectional view of a magnetoresistive element according to a second embodiment.

FIG. 5 shows a cross section of a magnetoresistive element according to a second embodiment. The magnetoresistive element 10B according to the second embodiment has a structure obtained by replacing the magnetic layer 14 of the magnetoresistive element 10 according to the first embodiment shown in FIG. 1 with a magnetic layer 14A.

The magnetic layer 14A includes a magnetic layer 14a disposed on the base layer 12, a crystal separation layer (fourth layer) 14b disposed on the magnetic layer 14a, and a magnetic layer 14c disposed on the crystal separation layer 14b. The magnetic layer 14a and the magnetic layer 14c are coupled by ferromagnetic coupling or antiferromagnetic coupling via the crystal separation layer 14b.

The magnetic layer 14a has high magnetic anisotropy, and includes FePt or FeNi, an artificial superlattice or $L1_0$-structure alloy of FePd or MnGa, or an artificial superlattice or alloy of CoPd, CoPt, or CoNi, a CoCrPt alloy, or a MnGa alloy having the $DO_{22}$ structure. The magnetic layer 14a may also be formed of a rare earth magnetic compound such as SmCo or TbCo. Thus, the magnetic layer 14a may include at least one of a $L1_0$-structure alloy containing Fe or MnGa, an artificial superlattice containing Co, CoCrPt, a $DO_{22}$-structure MnGa alloy, or a rare earth magnetic compound.

The magnetic layer 14c is formed of the same material as the magnetic layer 14 shown in FIG. 1. The crystal separation layer 14b is disposed between the magnetic layer 14a and the magnetic layer 14c, and acts to separate the crystal structure of the magnetic layer 14a and the magnetic layer 14c. The crystal separation layer 14b includes at least one element selected from the group consisting of B, Zr, Hf, Ta, Nb, Mo, W, Ti, V, Cr, Mn, Ni, Cu, Ru, Ag, Mg, and a rare earth element.

The magnetoresistive element according to the second embodiment, like that of the first embodiment, is capable of suppressing the insulation failure.

Although the magnetoresistive element 10B according to the second embodiment has a structure obtained by replacing the magnetic layer 14 of the magnetoresistive element 10 according to the first embodiment shown in FIG. 1 with the magnetic layer 14A, it may have a structure obtained by replacing the magnetic layer 14 of the magnetoresistive element 10A according to the modification of the first embodiment shown in FIG. 2 with the magnetic layer 14A.

Third Embodiment

Figure 6:
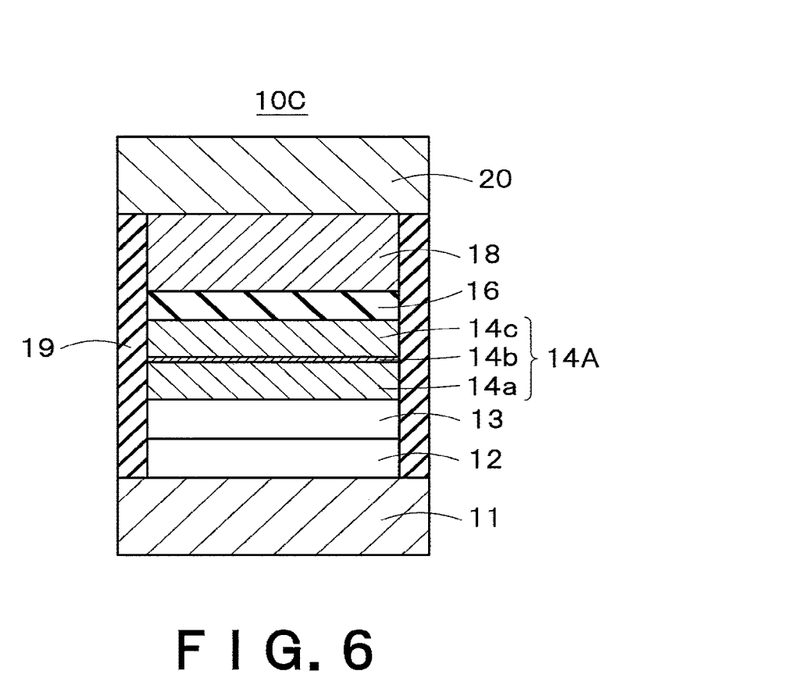
FIG. 6 is a cross-sectional view of a magnetoresistive element according to a third embodiment.

FIG. 6 shows a cross section of a magnetoresistive element according to a third embodiment. The magnetoresistive element 10C according to the third embodiment has a structure obtained by disposing a layer (fifth layer) 13 between the base layer 12 and the magnetic layer 14a in the magnetoresistive element 10B according to the second embodiment shown in FIG. 5.

The layer 13 is disposed to improve the crystallinity and the magnetic anisotropy of the magnetic layer 14a, and may be a crystal layer including a single element selected from Hf, Zr, Al, Cr, and Mg.

The layer 13 may also be a crystal layer including at least one element selected from the group consisting of Ru, Pt, Pd, Mo, W, and Ti. Also in this case, the crystallinity and the magnetic anisotropy of the magnetic layer 14a may be improved.

The magnetoresistive element according to the third embodiment, like that of the second embodiment, is capable of suppressing the insulation failure.

Although the magnetoresistive element 10C according to the third embodiment has the structure obtained by disposing the layer 13 between the base layer 12 and the magnetic layer 14a of the magnetoresistive element 10B according to the second embodiment shown in FIG. 5, it may also have a structure obtained by disposing the layer 13 between the base layer 12b and the magnetic layer 14 in the magnetoresistive element 10A according to the modification of the first embodiment shown in FIG. 2.

Fourth Embodiment

Figure 7:
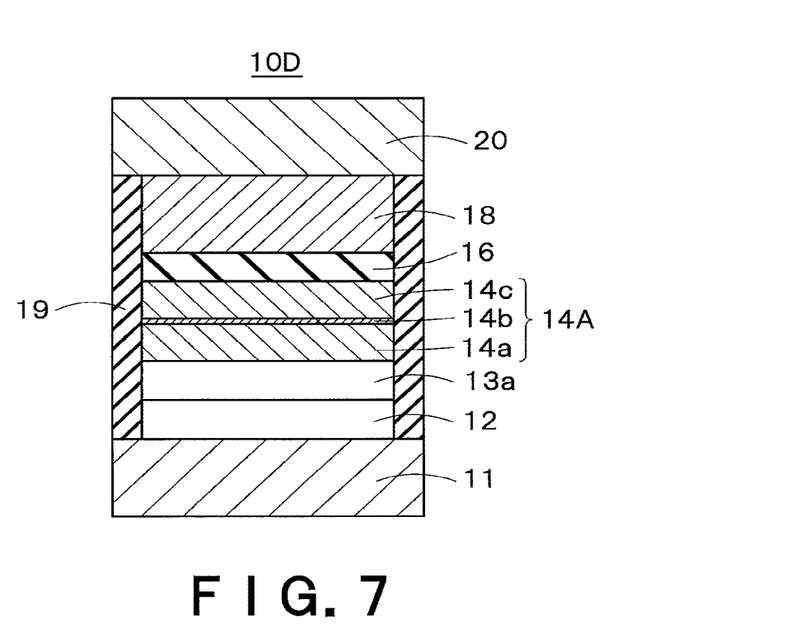
FIG. 7 is a cross-sectional view of a magnetoresistive element according to a fourth embodiment.

FIG. 7 shows a cross section of a magnetoresistive element according to a fourth embodiment. The magnetoresistive element 10D according to the fourth embodiment has a structure obtained by replacing the layer 13 of the magnetoresistive element 10C according to the third embodiment shown in FIG. 6 with a layer (fifth layer) 13a.

The layer 13a improves the crystallinity and the magnetic anisotropy of the magnetic layer 14a, and includes a nitride of at least one element selected from the group consisting of Hf, Zr, Al, Cr, Ti, Sc, and Mg.

The magnetoresistive element according to the fourth embodiment is capable of suppressing the insulation failure, like the magnetoresistive element according to the third embodiment. Since the layer 13a is formed of a nitride, the element diffusion between the magnetic layer 14a and the layer is suppressed. This improves the heat resistance.

Therefore, the magnetoresistive element according to the fourth embodiment may be easily produced by existing semiconductor processes, and has an advantage that a steeper interface may be obtained.

Although the magnetoresistive element 10D according to the fourth embodiment has the structure obtained by disposing the layer 13a instead of the layer 13 of the magnetoresistive element 10C according to the third embodiment shown in FIG. 6, it may also have a structure obtained by disposing a layer 13a between the base layer 12b and the magnetic layer 14 in the magnetoresistive element 10A according to the modification of the first embodiment shown in FIG. 2.

Fifth Embodiment

Figure 8:
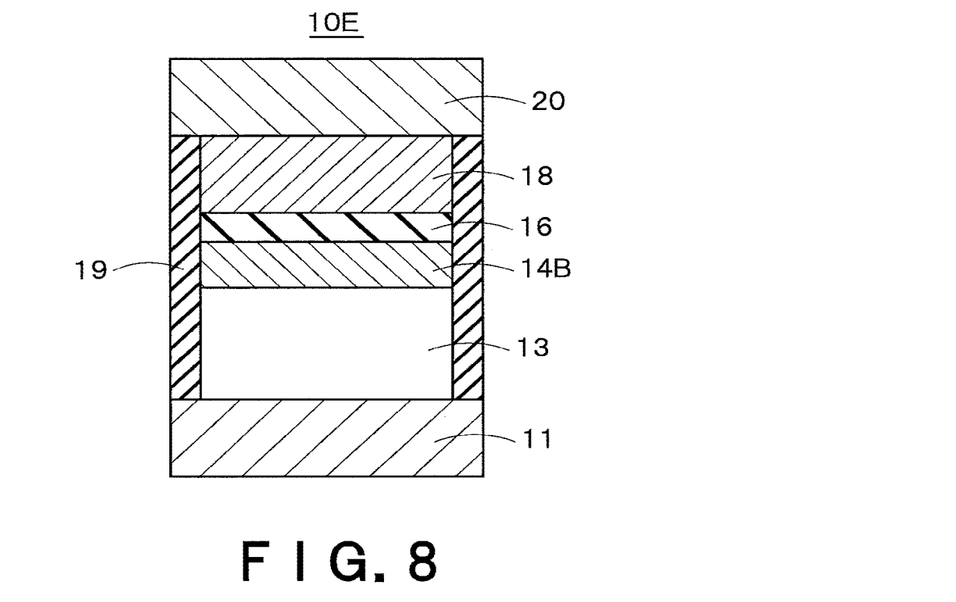
FIG. 8 is a cross-sectional view of a magnetoresistive element according to a fifth embodiment.

FIG. 8 shows a cross section of a magnetoresistive element according to a fifth embodiment. The magnetoresistive element 10E according to the fifth embodiment has a structure obtained by replacing the magnetic layer 14 of the magnetoresistive element 10 according to the first embodiment shown in FIG. 1 with a magnetic layer 14B, and the base layer 12 with the layer 13 of the magnetoresistive element 10C according to the third embodiment.

The material of the magnetic layer 14B is obtained by adding at least one element selected from the group consisting of Hf, Zr, Al, Cr, and Mg to the material of the magnetic layer 14.

The magnetoresistive element according to the fifth embodiment is capable of suppressing the insulation failure, like the magnetoresistive element according to the first embodiment.

Sixth Embodiment

Figure 9:
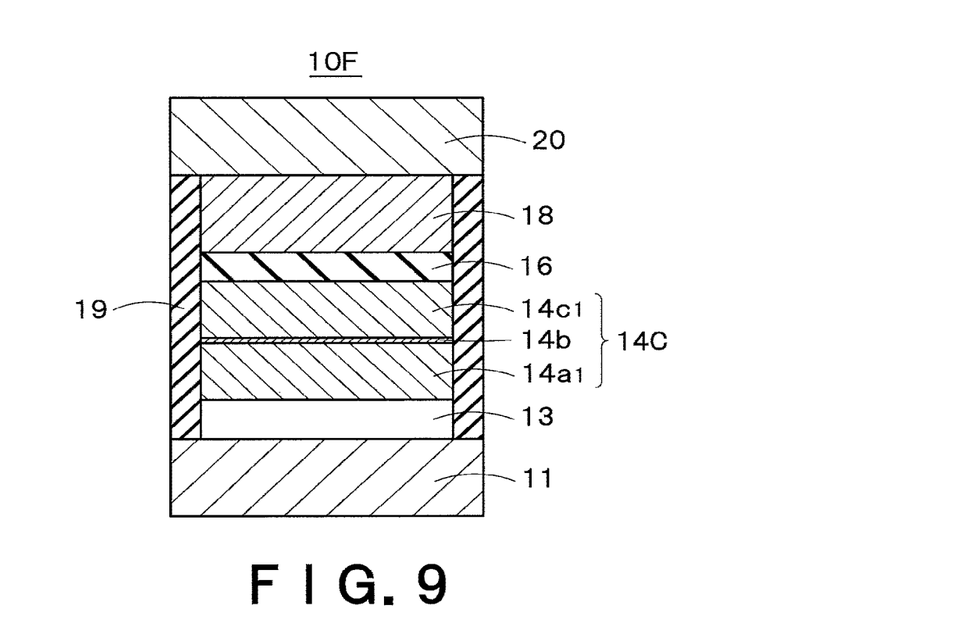
FIG. 9 is a cross-sectional view of a magnetoresistive element according to a sixth embodiment.

FIG. 9 shows a cross section of a magnetoresistive element according to a sixth embodiment. The magnetoresistive element 10F according to the sixth embodiment has a structure obtained by replacing the magnetic layer 14B of the magnetoresistive element 10E according to the fifth embodiment shown in FIG. 8 with a magnetic layer 14C.

The magnetic layer 14C has a multilayer structure in which a magnetic layer 14a1, a nonmagnetic layer 14b, and a magnetic layer 14c1 are stacked in this order. The material of the magnetic layers 14a1 and 14c1 are obtained by adding at least one element selected from the group consisting of Hf, Zr, Al, Cr, and Mg to the material of the magnetic layers 14a and 14c according to the second embodiment shown in FIG. 5. The nonmagnetic layer 14b is the same as the nonmagnetic layer 14b according to the second embodiment shown in FIG. 5. Thus, the nonmagnetic layer 14b includes at least one element selected from the group consisting of B, Zr, Hf, Ta, Nb, Mo, W, Ti, V, Cr, Mn, Ni, Cu, Ru, Ag, Mg, and a rare earth element.

The magnetoresistive element according to the sixth embodiment is also capable of suppressing the insulation failure, like the magnetoresistive element according to the fifth embodiment.

The "nitride" and the "oxide" herein may be a mixture of nitride or oxide with B, N, O, or C, and therefore may be "nitrogen-containing material," and "oxygen-containing material."

Seventh Embodiment

A magnetic memory (MRAM) according to a seventh embodiment will be described below.

Figure 10:
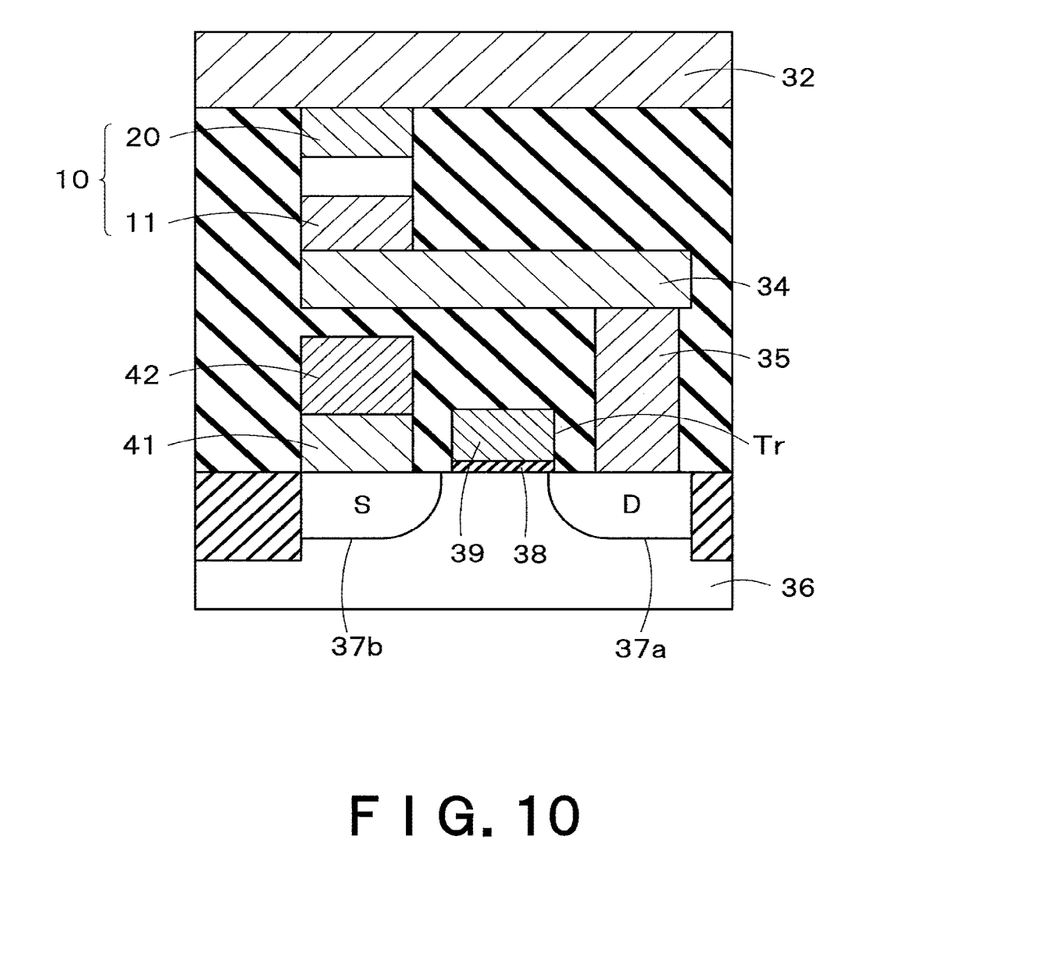
FIG. 10 is a cross-sectional view of a magnetic memory according to a seventh embodiment.

The MRAM according to the seventh embodiment includes a plurality of memory cells. FIG. 10 shows a cross section of a main portion of one of the memory cells of the MRAM according to the seventh embodiment. The memory cell includes a magnetoresistive element according to any of the first to sixth embodiments and their modifications as a storage element. In the descriptions of the seventh embodiment, the storage element is the magnetoresistive element 10 according to the first embodiment.

As shown in FIG. 10, the top surface of the magnetoresistive element 10 is connected to a bit line 32 via the upper electrode 20. The lower surface of the magnetoresistive element 10 is connected to a drain region 37a of source and drain regions near the surface of a semiconductor substrate 36 via the lower electrode 11, an extraction electrode 34, and a plug 35. The drain region 37a, a source region 37b, a gate insulating film 38 on the substrate 36, and a gate electrode 39 on the gate insulating film 38 form a selection transistor Tr. The selection transistor Tr and the magnetoresistive element 10 are included in one memory cell of the MRAM. The source region 37b is connected to another bit line 42 via a plug 41. The extraction electrode 34 may be eliminated, and the plug 35 may be disposed below the lower electrode 11 and directly connected to the lower electrode 11. The bit lines 32 and 42, the lower electrode 11, the upper electrode 20, the extraction electrode 34, and the plugs 35 and 41 are formed of such a material as W, Al, AlCu, or Cu.

Figure 11:
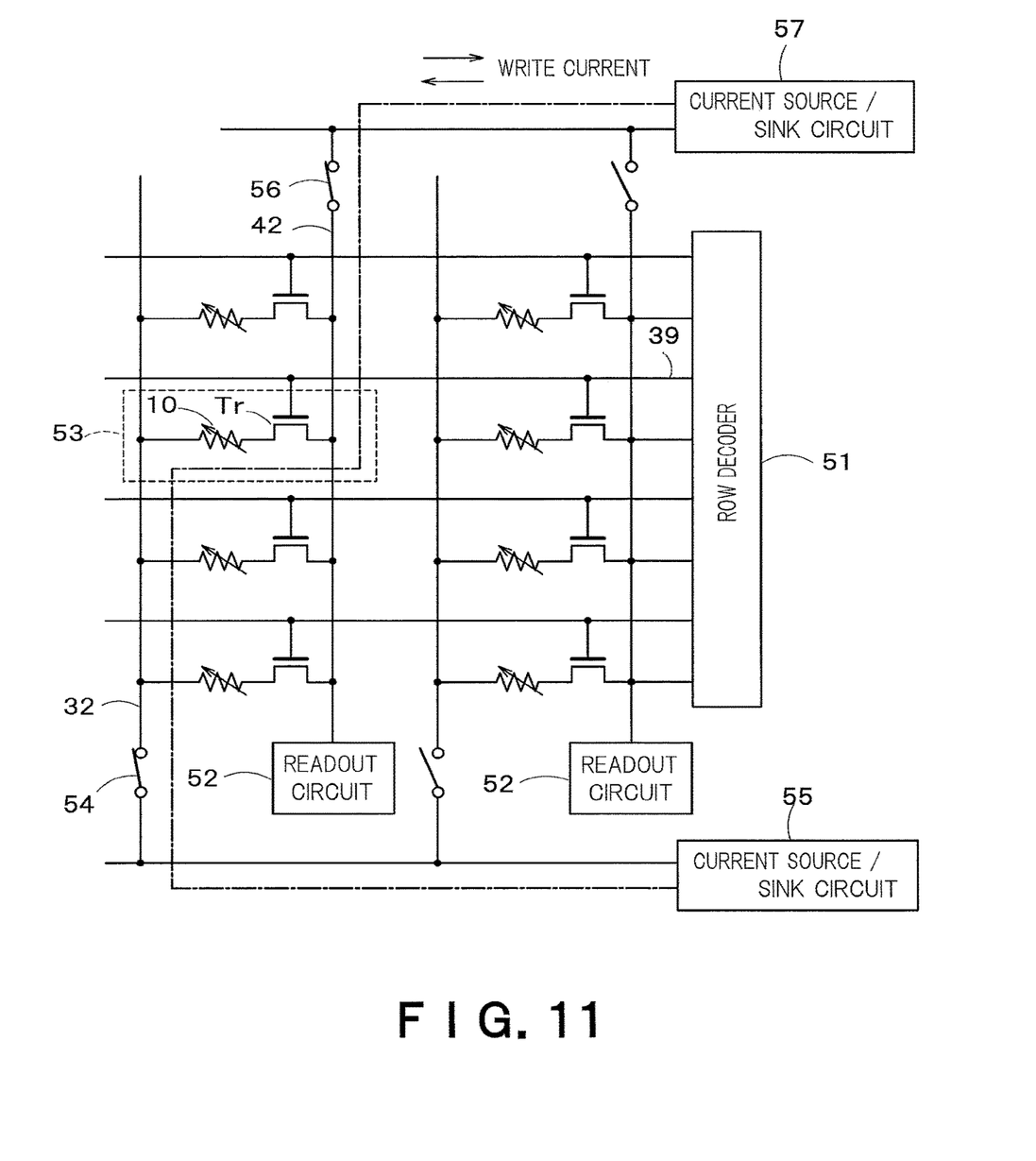
FIG. 11 is a circuit diagram of the magnetic memory according to the seventh embodiment.

A plurality of memory cells each being the one shown in FIG. 10 are arranged in rows and columns, for example, to form a memory cell array in the MRAM according to the seventh embodiment. FIG. 11 illustrates a circuit diagram showing a main portion of the MRAM according to the seventh embodiment.

As shown in FIG. 11, the memory cells 53 each including the magnetoresistive element 10 and the selection transistor Tr are arranged in rows and columns. First terminals of the memory cells 53 in the same column are connected to the same bit line 32, and second terminals are connected to the same bit line 42. Gate electrodes (word line) 39 of the selection transistors Tr of the memory cells 53 in the same row are mutually connected, and further connected to a row decoder 51.

The bit line 32 is connected to a current source/sink circuit 55 via a switch circuit 54 such as a transistor. The bit line 42 is connected to a current source/sink circuit 57 via a switch circuit 56 such as a transistor. The current source/sink circuits 55 and 57 supply or draw a write current to or from the connected bit lines 32 and 42.

The bit line 42 is also connected to a readout circuit 52. The readout circuit 52 may be connected to the bit line 32. The readout circuit 52 includes a read current circuit and a sense amplifier.

In a write operation, the switch circuits 54 and 56 and the selection transistor Tr connected to a target memory cell, to which data is to be written, are turned on to form a current path that passes the target memory cell. One of the current source/sink circuits 55 and 57 acts as a current source, and the other acts as a current sink depending on the contents of the data to be written. As a result, a write current is caused to flow in a direction that is determined by the data to be written.

With respect to the write speed, a spin transfer torque write operation may be performed with a current having a pulse width of several nanoseconds to several microseconds.

In a read operation, a read current that is low enough not to cause magnetization switching is supplied by the readout circuit 52 to a target magnetoresistive element 10 selected in the same manner as the write operation. The readout circuit 52 determines the resistance state of the magnetoresistive element 10 by comparing, with a reference value, a current value or voltage value relating to the resistance value determined in accordance with the state of the magnetization of the magnetoresistive element 10.

The current pulse width is preferably narrower in a read operation than in a write operation. This reduces erroneous writing caused by the read current flowing in a read operation. This is based on the fact that a write current with a narrower pulse width has a greater absolute value.

As described above, the magnetic memory according to the seventh embodiment includes magnetoresistive elements capable of suppressing the insulation failure.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
    a first magnetic layer;
    a second magnetic layer;
    a nonmagnetic layer disposed between the first magnetic layer and the second magnetic layer;
    a first layer including: at least one element selected from a first group consisting of Hf, Zr, Al, Cr, and Mg, the second magnetic layer being disposed between the first magnetic layer and the first layer;
    a second layer including at least one element selected from a second group consisting of Ge, Be, Li, Sn, Sb, and P, the second layer being disposed between the first layer and the second magnetic layer;
    a third layer including at least one element selected from a group consisting of Hf, Zr, Al, Cr, Ti, Sc, and Mg, the third layer being disposed between the second layer and the second magnetic layer; and
    an insulating layer disposed at least on a side surface of the nonmagnetic layer, the insulating layer including the at least one element selected from the first group, wherein:
    the second magnetic layer includes a third magnetic layer, a fourth magnetic layer disposed between the third magnetic layer and the nonmagnetic layer, and a fourth layer disposed between the third magnetic layer and the fourth magnetic layer;
    the third magnetic layer includes at least one of an alloy having a $L1_0$ structure containing Fe or MnGa, an artificial superlattice containing Co, CoCrPt, a MnGa alloy having a $DO_{22}$ structure, or a rare earth magnetic compound; and
    the fourth layer includes at least one of B, Zr, Hf, Ta, Nb, Mo, W, Ti, V, Cr, Mn, Ni, Cu, Ru, Ag, Mg, or a rare earth element.

2. The magnetoresistive element according to claim 1, wherein the third layer includes a nitride of the at least one element selected from the group consisting of Hf, Zr, Al, Cr, Ti, Sc, and Mg.

3. A magnetic memory comprising:
    the magnetoresistive element according to claim 1;

a first wiring electrically connected to the first magnetic layer of the magnetoresistive element; and a second wiring electrically connected to the second magnetic layer of the magnetoresistive element.

4. The magnetic memory according to claim 3, wherein the first layer includes an alloy of at least one element selected from the first group, and at least one element selected from the second group.

5. The magnetic memory according to claim 3, wherein the first layer has a first region and a second region disposed between the first region and the second magnetic layer, and the at least one element selected from the second group has a higher concentration in the second region than in the first region.

6. The magnetic memory according to claim 3, further comprising a fifth layer disposed between the first layer and the third magnetic layer, the fifth layer including at least one of Hf, Zr, Al, Cr, or Mg.

7. The magnetic memory according to claim 3, further comprising a fifth layer disposed between the first layer and the third magnetic layer, the fifth layer including at least one of Ru, Pt, Pd, Mo, W, or Ti.

8. The magnetic memory according to claim 3, further comprising a fifth layer disposed between the first layer and the third magnetic layer, the fifth layer including a nitride of at least one of Hf, Zr, Al, Cr, Ti, Sc, or Mg.

9. A magnetoresistive element comprising:
a first magnetic layer;
a second magnetic layer;
a nonmagnetic layer disposed between the first magnetic layer and the second magnetic layer;
a first layer including: at least one element selected from a first group consisting of Hf, Zr, Al, Cr, and Mg; and at least one element selected from a second group consisting of Ta, W, Nb, Ge, Be, Li, Sn, Sb, and P, the second magnetic layer being disposed between the first layer and the first magnetic layer;
a second layer including at least one element selected from a group consisting of Hf, Zr, Al, Cr, Ti, Sc, and Mg, the second layer being disposed between the first layer and the second magnetic layer; and
an insulating layer disposed at least on a side surface of the nonmagnetic layer, the insulating layer including at least one element selected from the first group, wherein the first layer includes a first region and a second region disposed between the first region and the second magnetic layer, and the at least one element selected from the second group has a higher concentration in the second region than in the first region.

10. The magnetoresistive element according to claim 9, wherein the second layer includes a nitride of the at least one element selected from the group consisting of Hf, Zr, Al, Cr, Ti, Sc, and Mg.

11. A magnetoresistive element comprising:
a first layer;
a first magnetic layer;
a second magnetic layer disposed between the first layer and the first magnetic layer;
a nonmagnetic layer disposed between the first magnetic layer and the second magnetic layer; and
an insulating layer disposed on at least side surfaces of the nonmagnetic layer, wherein
the first layer includes at least one of Hf, Zr, Al, Cr, or Mg; or at least one of Ru, Pt, Pd, W, or Ti,
the second magnetic layer includes a third magnetic layer, a fourth magnetic layer disposed between the third magnetic layer and the nonmagnetic layer, and a second layer disposed between the third magnetic layer and the fourth magnetic layer,
the third magnetic layer includes at least one of an alloy having a L10 structure containing Fe or MnGa, an artificial superlattice containing Co, CoCrPt, a MnGa alloy having a DO22 structure, or a rare earth magnetic compound,
the second layer includes at least one of B, Zr, Hf, Ta, Nb, Mo, W, Ti, V, Cr, Mn, Ni, Cu, Ru, Ag, Mg, or a rare earth element,
at least one of the third magnetic layer and the fourth magnetic layer includes at least one of Hf, Zr, Al, Cr, or Mg, and
the insulating layer includes at least one of Hf, Zr, Al, Cr, or Mg.

12. A magnetic memory comprising:
the magnetoresistive element according to claim 11;
a first wiring electrically connected to the first magnetic layer of the magnetoresistive element; and
a second wiring electrically connected to the second magnetic layer of the magnetoresistive element.

* * * * *